(12) United States Patent
Fukui et al.

(10) Patent No.: US 12,406,845 B2
(45) Date of Patent: Sep. 2, 2025

(54) α-Ga₂O₃ SEMICONDUCTOR FILM (71) Applicant: NGK INSULATORS, LTD., Nagoya (JP)

(72) Inventors: Hiroshi Fukui, Obu (JP); Morimichi Watanabe, Nagoya (JP); Jun Yoshikawa, Nagoya (JP)

(73) Assignee: NGK INSULATORS, LTD., Nagoya (JP)

(*) Notice: Subject to any disclaimer, the term of this patent is extended or adjusted under 35 U.S.C. 154(b) by 599 days.

(21) Appl. No.: 17/653,146

(22) Filed: Mar. 2, 2022

(65) Prior Publication Data
US 2022/0238645 A1   Jul. 28, 2022

Related U.S. Application Data (63) Continuation of application No. PCT/JP2019/038518, filed on Sep. 30, 2019.

(51) Int. Cl.
*H01L 21/02* (2006.01)
*C23C 16/40* (2006.01)
(Continued)

(52) U.S. Cl.
CPC ........ H01L 21/02565 (2013.01); C23C 16/40 (2013.01); C23C 16/4481 (2013.01);
(Continued)

(58) Field of Classification Search
CPC ............. H01L 21/02565; H01L 29/24; H01L 29/66969; C23C 16/40; H10D 62/405; H10D 62/80
See application file for complete search history.

(56) References Cited

U.S. PATENT DOCUMENTS

2015/0279944 A1* 10/2015 Hitora ............... H01L 21/02565
257/43
2017/0179249 A1   6/2017 Oda et al.
(Continued)

FOREIGN PATENT DOCUMENTS

CN     107068773 A    8/2017
JP     2014-072533 A  4/2014
(Continued)

OTHER PUBLICATIONS

Ma, T.C. et al. "On the origin of dislocation generation and annihilation in α-Ga2O3 epilayers on sapphire." Appl. Phys. Lett. 115, 182101 (2019). (Year: 2019).*
(Continued)

*Primary Examiner* — Yara B Green
*Assistant Examiner* — Christopher M Roland
(74) *Attorney, Agent, or Firm* — BURR PATENT LAW, PLLC (57) ABSTRACT

An α-Ga₂O₃ semiconductor film according to the present invention has a measurement point (dark spot) with a maximum emission intensity A of not more than 0.6 times the average value X of top 5% of the maximum emission intensities A at all measurement points in intensity mapping of plane cathodoluminescence, wherein the maximum emission intensity A at each measurement point is determined in the wavelength range of 250 to 365 nm.

3 Claims, 6 Drawing Sheets (51) Int. Cl.
    *C23C 16/448*    (2006.01)
    *H10D 62/40*     (2025.01)
    *H10D 62/80*     (2025.01)
    *H10D 8/60*      (2025.01)
    *H10D 99/00*     (2025.01)

(52) U.S. Cl.
    CPC .... *H01L 21/02414* (2013.01); *H01L 21/0242* (2013.01); *H01L 21/0243* (2013.01); *H01L 21/0262* (2013.01); *H01L 21/02628* (2013.01); *H10D 62/405* (2025.01); *H10D 62/80* (2025.01); *H10D 8/60* (2025.01); *H10D 99/00* (2025.01)

(56) References Cited

U.S. PATENT DOCUMENTS

| | | | | |
|---|---|---|---|---|
| 2018/0061952 | A1* | 3/2018 | Tokuda | H01L 21/0242 |
| 2019/0057866 | A1* | 2/2019 | Oshima | C30B 29/16 |
| 2019/0067426 | A1* | 2/2019 | Sugimoto | H01L 21/02576 |
| 2021/0226002 | A1* | 7/2021 | Takahashi | H01L 21/0262 |
| 2021/0404089 | A1* | 12/2021 | Watanabe | H01L 21/02658 |
| 2021/0404090 | A1* | 12/2021 | Watanabe | H01L 21/0254 |
| 2021/0408242 | A1* | 12/2021 | Watanabe | C30B 29/16 |
| 2022/0029022 | A1* | 1/2022 | Watanabe | C23C 16/029 |
| 2022/0059424 | A1* | 2/2022 | Hashigami | H01L 21/02565 |
| 2024/0003043 | A1* | 1/2024 | Yoshikawa | H10D 8/00 |

FOREIGN PATENT DOCUMENTS

| | | |
|---|---|---|
| JP | 2016-025256 A | 2/2016 |
| JP | 2016-100592 A | 5/2016 |
| JP | 2016-100593 A | 5/2016 |
| JP | 2016-155963 A | 9/2016 |
| JP | 2017-118090 A | 6/2017 |
| JP | 2019-033142 A | 2/2019 |

OTHER PUBLICATIONS

Stepanov, S.I. et al. "HVPE growth of corundum-structured α-Ga2O3 on sapphire substrates with α-Cr2O3 buffer layer." Materials Physics and Mechanics 47 (2021) 577-581. (Year: 2021).*

Polyakov, A. et al. "Effects of sapphire substrate orientation on Sn-doped α-Ga2O3 growth by halide vapor phase epitaxy using α-Ga2O3 buffers." J. Phys. D: Appl. Phys. 55 (2022) 495102 (6pp). (Year: 2022).*

Dang, G.T. et al. "Growth of α-Cr2O3 single crystals by mist CVD using ammonium dichromate." Applied Physics Express 11, 111101 (2018). (Year: 2018).*

English translation of the International Preliminary Report on Patentability (Chapter I) dated Apr. 14, 2022 (Application No. PCT/JP2019/038518).

International Search Report and Written Opinion (Application No. PCT/JP2019/038518) dated Dec. 3, 2019.

Chinese Office Action dated Jun. 29, 2023 (Application No. 201980098097.5).

* cited by examiner

α-Ga$_2$O$_3$ SEMICONDUCTOR FILM

BACKGROUND OF THE INVENTION

1. Field of the Invention

The present invention relates to an α-Ga$_2$O$_3$ semiconductor film.

2. Description of the Related Art

In recent years, gallium oxide (Ga$_2$O$_3$) has attracted attention as a semiconductor material. Gallium oxide is known to have five crystal forms of α, β, γ, δ, and E, among which α-Ga$_2$O$_3$ has a very large band gap of 5.3 eV and is expected as a power semiconductor material. Because α-Ga$_2$O$_3$ is a metastable phase, however, α-Ga$_2$O$_3$ has not been practically used as a single-crystal substrate and is generally formed on a sapphire substrate by heteroepitaxial growth.

For example, PTL 1 discloses a semiconductor device including a base substrate with a corundum crystal structure, a semiconductor layer with a corundum crystal structure, and an insulating film with a corundum crystal structure, and describes an example in which an α-Ga$_2$O$_3$ film is formed as a semiconductor layer on a sapphire substrate. PTL 2 discloses a semiconductor device including an n-type semiconductor layer composed mainly of a crystalline oxide semiconductor with a corundum structure, a p-type semiconductor layer composed mainly of an inorganic compound with a hexagonal crystal structure, and an electrode. PTL 2 discloses in an example that a diode is produced by forming an α-Ga$_2$O$_3$ film with a corundum structure, which is a metastable phase, as an n-type semiconductor layer and an α-Rh$_2$O$_3$ film with a hexagonal crystal structure as a p-type semiconductor layer on a C-plane sapphire substrate.

However, there is a problem that a crack or a crystal defect is formed when an α-Ga$_2$O$_3$ film is grown on different substrates. When an InAlGaO semiconductor film, which is a mixed crystal of α-Ga$_2$O$_3$ and a different corundum material, is formed, in general, there is a cracking problem in an epitaxial film due to crystal growth on different substrates. As a technique to solve this problem, PTL 3 discloses the production of an α-Ga$_2$O$_3$ film with fewer cracks. PTL 4 discloses that an α-Ga$_2$O$_3$ film with fewer cracks is produced by forming voids during the formation of an epitaxial film. PTL 5 shows a result of cross-sectional CL intensity mapping of an α-Ga$_2$O$_3$ film using a cathodoluminescence (CL) spectrometer (a graph showing the relationship between the wavelength and emission intensity).

CITATION LIST

Patent Literature

PTL 1: JP 2014-072533 A
PTL 2: JP 2016-025256 A
PTL 3: JP 2016-100592 A
PTL 4: JP 2016-100593 A
PTL 5: JP 2016-155963 A

SUMMARY OF THE INVENTION

Although various α-Ga$_2$O$_3$ films have been produced as described above, it has been desired to develop a useful α-Ga$_2$O$_3$ semiconductor film different from known films.

The present invention has been made to solve such problems and mainly aims to provide a novel α-Ga$_2$O$_3$ semiconductor film.

An α-Ga$_2$O$_3$ semiconductor film according to the present invention has a measurement point with a maximum emission intensity A of not more than 0.6 times the average value X of top 5% of the maximum emission intensities A at all measurement points in intensity mapping of plane CL, wherein the maximum emission intensity A at each measurement point is determined in the wavelength range of 250 to 365 nm. A measurement point with a maximum emission intensity A of not more than 0.6 times the X is hereinafter referred to as a dark spot.

This α-Ga$_2$O$_3$ semiconductor film is a novel semiconductor film and has fewer cracks.

BRIEF DESCRIPTION OF THE DRAWINGS

FIGS. 1A and 1B are explanatory views of a multilayer structure 10, wherein FIG. 1A is a plan view, and FIG. 1B is a cross-sectional view taken along the line A-A.

DETAILED DESCRIPTION OF THE INVENTION

[Multilayer Structure]

Figure 1A:
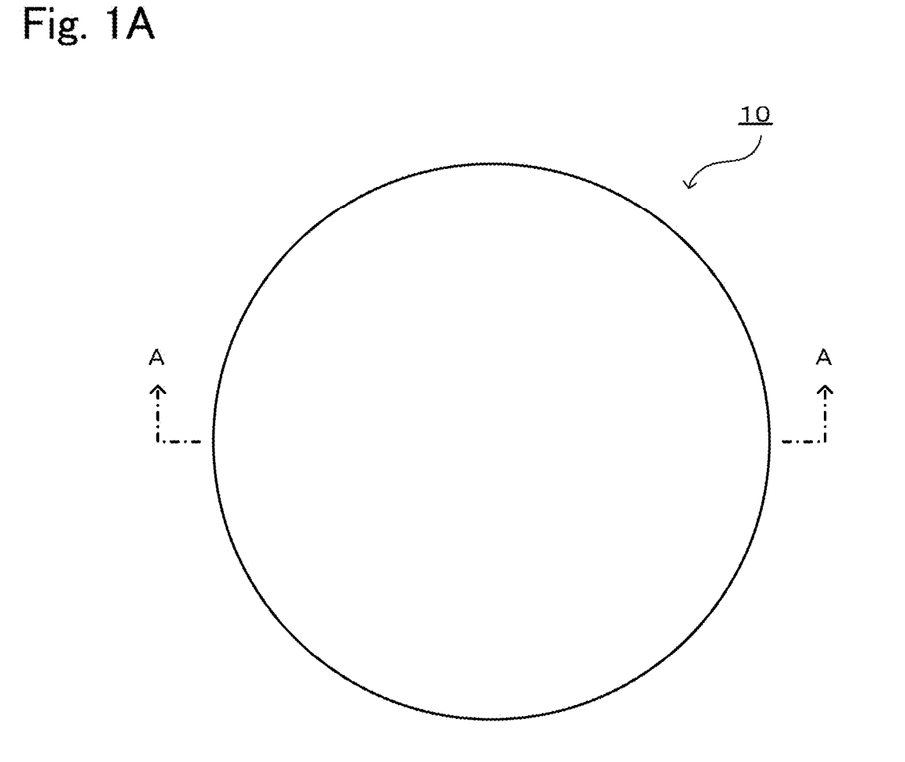
Figure 1B:
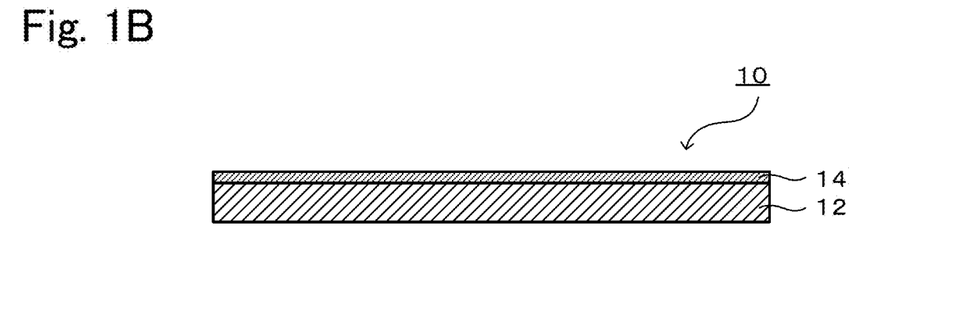

FIGS. 1A and 1B are explanatory views of a multilayer structure 10, wherein 1A is a plan view, and 1B is a cross-sectional view taken along the line A-A.

The multilayer structure 10 is a plate-like member and has a semiconductor film 14 on a base substrate 12. When viewed in a plan view, the multilayer structure 10 in the present embodiment is circular. The "circular" is not necessarily perfect circular and may also be generally circular that can be generally recognized as circular as a whole. For example, the circle may be partly cut out to specify the crystal orientation or for another purpose. When viewed in a plan view, the multilayer structure 10 is not limited to circular and may be polygonal (tetragonal, such as square or rectangular, pentagonal, hexagonal, etc.).

The base substrate 12 preferably has a layer of an oxide (α-Cr$_2$O$_3$, α-Fe$_2$O$_3$, etc.) with a lattice constant closer to α-Ga$_2$O$_3$ than sapphire and more preferably has a single-crystal layer of α-Cr$_2$O$_3$ or α-Cr$_2$O$_3$ solid solution.

The semiconductor film 14 is a semiconductor film with a corundum crystal structure formed of α-Ga$_2$O$_3$ or α-Ga$_2$O$_3$ solid solution, that is, an α-Ga$_2$O$_3$ semiconductor film. α-Ga$_2$O$_3$ belongs to the trigonal crystal group and has a corundum crystal structure. α-Ga$_2$O$_3$ solid solution is a solid solution of another component dissolved in α-Ga$_2$O$_3$ and maintains the corundum crystal structure. The other component is Al$_2$O$_3$, In$_2$O$_3$, Cr$_2$O$_3$, Fe$_2$O$_3$, Rh$_2$O$_3$, V$_2$O$_3$, or Ti$_2$O$_3$, for example.

The semiconductor film 14 includes a dark spot, which is defined as a measurement point with a maximum emission intensity A of not more than 0.6 times the average value X of the top 5% of the maximum emission intensities A at all measurement points in intensity mapping of plane CL, wherein the maximum emission intensity A at each measurement point is determined in the wavelength range of 250 to 365 nm. The semiconductor film 14 has fewer cracks. The physical meaning of a dark portion of a plane CL mapping image detected as a dark spot in an $\alpha$-$Ga_2O_3$ semiconductor film has not been clarified, and the reason for the effect of suppressing cracking is also unknown. For example, an $\alpha$-$Ga_2O_3$ film formed directly on sapphire has a large number of edge dislocations and screw dislocations but has no dark spot detected in a CL mapping image in the wavelength range of 250 to 365 nm. A dark spot defined in the present application is therefore not caused by these dislocations. Thus, crystal defects not attributable to edge dislocations, screw dislocations, mixed dislocations, or the like may be present, and such defects may cause dark spots. Such a defect may relieve the stress caused by film formation and suppress cracking in a semiconductor film.

Furthermore, the ratio R of the number of dark spots to the number of all measurement points in the semiconductor film 14 is preferably smaller, preferably 0.600 or less, more preferably 0.200 or less, in terms of electrical characteristics, for example, to reduce leakage current when the semiconductor film 14 is used for a Schottky barrier diode. Although a dark spot is considered to be a defect not attributable to a dislocation, as described above, an excessive number of dark spots affect electrical characteristics. On the other hand, to suppress cracking in a semiconductor film, R is preferably larger, preferably 0.005 or more, more preferably 0.050 or more. Thus, to reduce leakage current and cracking in a Schottky barrier diode, R preferably ranges from 0.005 to 0.600, more preferably 0.050 to 0.200.

The measurement conditions for intensity mapping of plane CL are described below. Emission intensity in the intensity mapping measurement is expressed in arbitrary unit (a.u.).

Measurement range: 5 μm×5 μm of a plane (surface) of the semiconductor film 14, 20 fields
Accelerating voltage: 10 kV
Measurement temperature: room temperature
Diffraction grating of spectrometer: 100 gr/mm, blaze wavelength 450 nm
Number of CL image pixels: 51×51=2601
(A 5 μm×5 μm square area was divided into 2601 regions to measure CL intensity. One measurement point is calculated to be an approximately 98 nm×approximately 98 nm region.)

The area of a surface of the semiconductor film 14 is substantially the same as the area of the base substrate 12. The area of a surface of the semiconductor film 14 is preferably 20 cm² or more, more preferably 70 cm² or more, still more preferably 170 cm² or more. The area of the semiconductor film 14 can be increased in this manner to produce a large number of semiconductor elements from one semiconductor film 14 and thereby reduce production costs. The upper limit of the size of the semiconductor film 14 is typically, but not limited to, 700 cm² or less on one side. The semiconductor film 14 preferably has an average thickness of 3 μm or more, more preferably 5 μm or more, still more preferably 8 μm or more.

The semiconductor film 14 can contain $1.0\times10^{16}$ to $1.0\times10^{21}/cm^3$ of a group 14 element as a dopant. The group 14 element herein refers to a group 14 element in the periodic table of the International Union of Pure and Applied Chemistry (IUPAC), more specifically, any one element of carbon (C), silicon (Si), germanium (Ge), tin (Sn), and lead (Pb). The amount of the dopant may depend on the desired characteristics and preferably ranges from $1.0\times10^{16}$ to $1.0\times10^{21}/cm^3$, more preferably $1.0\times10^{17}$ to $1.0\times10^{19}/cm^3$. Preferably, the dopant is uniformly distributed in the film, and the dopant concentration of the semiconductor film 14 is almost the same on the front and back surfaces.

Furthermore, the semiconductor film 14 is preferably an alignment film oriented in a specific plane direction. The orientation of the semiconductor film 14 can be examined by a known method, for example, by inverse pole figure orientation mapping with an electron beam backscatter diffraction device (EBSD). For example, the semiconductor film may be oriented in the C-axis direction or may be oriented in the C-axis direction and in the in-plane direction.

[Method for Producing Semiconductor Film]

A method for producing the semiconductor film 14 includes (a) the step of forming the multilayer structure 10 and (b) the step of separating the semiconductor film 14 from the base substrate 12.

(a) Step of Forming Multilayer Structure 10

The multilayer structure 10 is produced by forming the semiconductor film 14 on the base substrate 12 formed of an oxide ($\alpha$-$Cr_2O_3$, $\alpha$-$Fe_2O_3$, etc.) with a lattice constant closer to $\alpha$-$Ga_2O_3$ than sapphire. The base substrate 12 is a $Cr_2O_3$ single-crystal substrate, for example. The film-forming method may be, but is not limited to, a known method. The film-forming method is preferably mist CVD, HVPE, MBE, MOCVD, sputtering, or a hydrothermal method, more preferably mist CVD or HVPE, still more preferably mist CVD.

Figure 2:
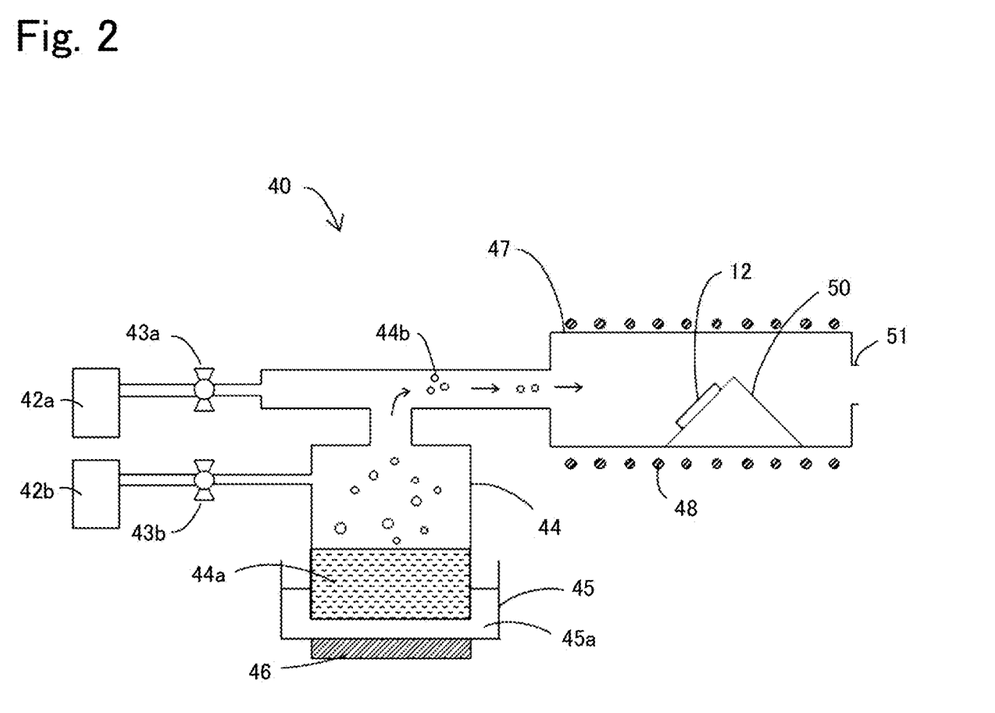
FIG. 2 is a schematic cross-sectional view of the structure of a mist CVD apparatus 40.

FIG. 2 is a schematic cross-sectional view of the structure of a mist CVD apparatus 40. The mist CVD apparatus 40 includes a susceptor 50 on which the base substrate 12 is to be placed, a diluent gas source 42a, a carrier gas source 42b, a flow control valve 43a for adjusting the flow rate of diluent gas from the diluent gas source 42a, a flow control valve 43b for adjusting the flow rate of carrier gas from the carrier gas source 42b, a mist generation source 44 for containing a raw material solution 44a, a container 45 for water 45a, an ultrasonic transducer 46 on the bottom of the container 45, a quartz tube 47 serving as a film formation chamber, a heater 48 around the quartz tube 47, and an exhaust port 51. The susceptor 50 is made of quartz and has an inclined surface on which the base substrate 12 is to be placed.

The raw material solution 44a for use in the mist CVD method may be any solution for an $\alpha$-$Ga_2O_3$ semiconductor film, for example, a solution of at least one of organometallic complexes of Ga, Ga halides, and organometallic complexes of Ga and a metal forming a solid solution, dissolved in a solvent. Examples of the organometallic complexes include acetylacetonate complexes, and examples of the halides include $GaCl_3$ and $GaBr_3$. When a halide is dissolved in a solvent as a raw material, the raw material solution contains a halogen element. To facilitate the preparation for the solution, the halide may be dissolved directly in the solvent or may be dissolved in water to which a hydrohalic acid (for example, hydrochloric acid) is added, or metal Ga may be dissolved in a solution of water and a hydrohalic acid. To form an $\alpha$-$Ga_2O_3$ semiconductor film containing a group 14 element as a dopant or to form a mixed crystal film with $\alpha$-$Ga_2O_3$ containing an oxide of In or Al, a solution containing these components may be added to the raw material solution. Furthermore, when an organometallic complex is used as a raw material, an additive agent, such as a hydrohalic acid, may be added to the raw material solution. The solvent may be water or an alcohol, etc.

Next, the raw material solution 44a is atomized to generate a mist 44b. A preferred example of the atomization method is a method of vibrating the raw material solution 44a with the ultrasonic transducer 46. The mist 44b is then transported to the film formation chamber using a carrier gas. The carrier gas may be, but is not limited to, one or two or more of inert gases, such as oxygen, ozone, and nitrogen, and reducing gases, such as hydrogen.

The base substrate 12 is placed in the film formation chamber (the quartz tube 47). The mist 44b transported to the film formation chamber is subjected to thermal decomposition and a chemical reaction and forms a film on the base substrate 12. Depending on the type of raw material solution, the reaction temperature preferably ranges from 300° C. to 800° C., more preferably 350° C. to 700° C. The atmosphere in the film formation chamber is not particularly limited as long as a desired semiconductor film is formed, may be an oxygen gas atmosphere, an inert gas atmosphere, a vacuum, or a reducing atmosphere, and is preferably an air atmosphere. Instead of or in addition to the mist 44b, a droplet of the raw material solution 44a may be used.

Figure 3:
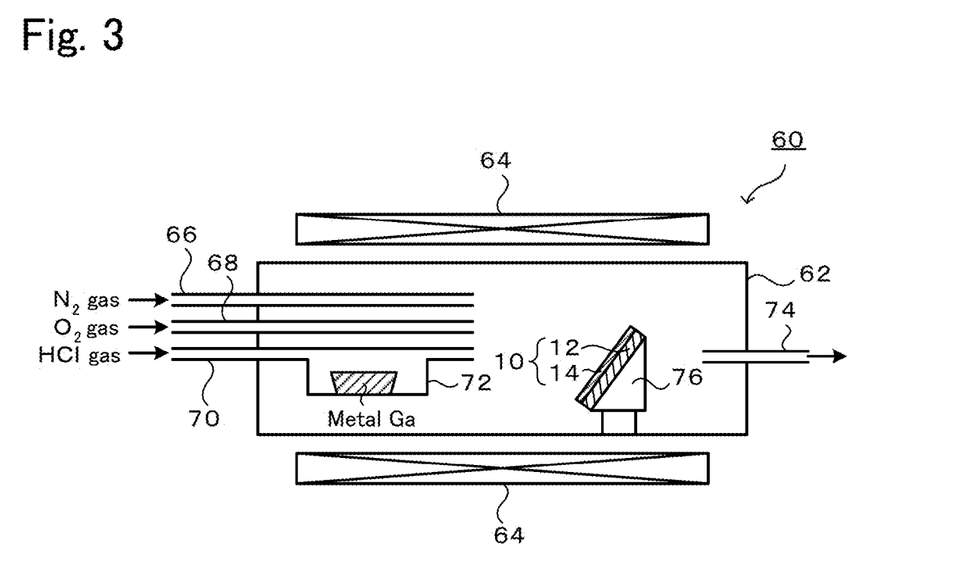
FIG. 3 is a schematic cross-sectional view of the structure of a vapor-phase growth apparatus 60.

FIG. 3 is a schematic cross-sectional view of the structure of a vapor-phase growth apparatus 60 using HVPE. The vapor-phase growth apparatus 60 includes a reaction vessel 62 and a heater 64.

The reaction vessel 62 is made of a material that does not react with raw materials or products (for example, quartz). A carrier gas supply pipe 66, an oxidizing gas supply pipe 68, and a raw material supply pipe 70 are attached to one of opposite side surfaces of the reaction vessel 62, and an exhaust pipe 74 is attached to the other side surface. A carrier gas (for example, nitrogen, a noble gas, etc.) is supplied to the reaction vessel 62 through the carrier gas supply pipe 66. Oxygen gas is supplied as an oxidizing gas to the reaction vessel 62 through the oxidizing gas supply pipe 68. The oxidizing gas other than oxygen may be water vapor or dinitrogen monoxide. In the raw material supply pipe 70, a halogen gas (for example, chlorine gas) or a hydrogen halide gas (for example, hydrogen chloride gas) supplied from a gas supply source reacts with metal gallium in a storage portion 72 provided in the middle of the raw material supply pipe 70 and generates gallium halide. Thus, the gallium halide gas is supplied as a raw material gas to the reaction vessel 62 through the raw material supply pipe 70. The halogen gas or hydrogen halide gas may be supplied together with a carrier gas, such as nitrogen or a noble gas. A susceptor 76 for detachably holding the base substrate 12 is located downstream of the supply pipes 66, 68, and 70 in the reaction vessel 62. Unreacted gases are discharged from the reaction vessel 62 through the exhaust pipe 74. The exhaust pipe 74 may be coupled to a vacuum pump, which adjust the degree of vacuum in the reaction vessel 62. This can suppress a gas-phase reaction or improve the growth rate distribution.

The heater 64 surrounds the reaction vessel 62. A resistance heater can be adopted as the heater 64, for example.

Production of the multilayer structure 10 according to the present embodiment using the vapor-phase growth apparatus 60 is described below. In the reaction vessel 62, the oxygen gas from the oxidizing gas supply pipe 68 reacts with the raw material gas (gallium halide gas) from the raw material supply pipe 70 and forms the semiconductor film 14 ($\alpha$-$Ga_2O_3$ film) on the base substrate 12. The film-forming temperature is not particularly limited and may be appropriately set in the range of 300° C. to 800° C. The partial pressure of the oxygen gas or the raw material gas is not particularly limited. For example, the partial pressure of the raw material gas may range from 0.05 to 10 kPa, and the partial pressure of the oxygen gas may range from 0.25 to 50 kPa. The growth time may be appropriately determined according to the designed thickness of the semiconductor film 14. The multilayer structure 10 is thus formed.

(b) Step of Separating Semiconductor Film 14 from Base Substrate 12

The semiconductor film 14 can be separated from the base substrate 12 of the multilayer structure 10 at room temperature by any method, including a known method. The separation method may be a separation method with mechanical impact, a separation method of applying heat to utilize thermal stress, or a separation method of applying vibration, such as ultrasonic waves. The semiconductor film 14 can be separated as a free-standing film. Alternatively, the semiconductor film 14 may be transferred onto another supporting substrate.

The above-described $\alpha$-$Ga_2O_3$ semiconductor film according to the present embodiment is a hitherto unknown novel film and can improve the device characteristics due to its high dielectric breakdown electric field characteristics. For example, the $\alpha$-$Ga_2O_3$ semiconductor film can be used for a Schottky barrier diode to reduce leakage current.

It goes without saying that the present invention should not be limited to these embodiments and can be implemented in various aspects within the technical scope of the present invention.

EXAMPLES

Examples according to the present invention are described below. It should be noted that the present invention is not limited to these examples.

Example 1

The mist CVD apparatus 40 illustrated in FIG. 2 was used to form an $\alpha$-$Ga_2O_3$ film (semiconductor film) by the following method. The base substrate 12 was a commercial $Cr_2O_3$ single crystal (8 mm×8 mm, 0.5 mm in thickness, C-plane, no off-angle, hereinafter referred to as a $Cr_2O_3$ substrate).

(1) Formation of $\alpha$-$Ga_2O_3$ Film by Mist CVD Method
(1a) Adjustment of Raw Material Solution An aqueous solution was adjusted at a gallium acetylacetonate concentration of 0.08 mol/L. The aqueous solution contained 1.5% by volume of 36% hydrochloric acid. Tin(II) chloride dihydrate ($SnCl_2 \cdot 2H_2O$) was added to the aqueous solution such that the atomic ratio of tin to gallium was 0.2. The aqueous solution was used as the raw material solution 44a.

(1b) Preparation of Film Formation

Next, the raw material solution 44a was poured into the mist generation source 44 of the mist CVD apparatus 40 illustrated in FIG. 2. A $Cr_2O_3$ substrate was placed on the susceptor 50 as the base substrate 12, and the temperature in the quartz tube 47 was increased to 580° C. with the heater 48. The flow control valves 43a and 43b were then opened to supply a diluent gas and a carrier gas to the quartz tube 47 from the diluent gas source 42a and the carrier gas source 42b. After the atmosphere in the quartz tube 47 was sufficiently replaced with the diluent gas and the carrier gas, the flow rate of the diluent gas was adjusted to 0.5 L/min, and the flow rate of the carrier gas was adjusted to 1 L/min. Nitrogen gas was used as the diluent gas and the carrier gas.

(1c) Film Formation

Next, the ultrasonic transducer 46 was vibrated at 2.4 MHz, and the vibration was transmitted through the water 45a to the raw material solution 44a to form the mist 44b of the raw material solution 44a. The mist 44b was introduced with the diluent gas and the carrier gas into the quartz tube 47 serving as a film formation chamber, was reacted in the quartz tube 47, and formed a crystalline α-$Ga_2O_3$ semiconductor film (semiconductor layer) on the base substrate 12 by a CVD reaction on the surface of the base substrate 12. The film-forming time was 40 minutes. Thus, the multilayer structure 10 with the semiconductor film 14 on the base substrate 12 was formed.

(2) Evaluation of Semiconductor Film (2a) Surface EDS

EDS measurement of a film surface on the film formation side of the resulting film showed that only Ga and O were detected, and the film was Ga oxide.

(2b) EBSD

A SEM (SU-5000, manufactured by Hitachi High-Technologies Corporation) equipped with an electron beam back-scatter diffraction apparatus (EBSD) (Nordlys Nano, manufactured by Oxford Instruments) was used to perform inverse pole figure orientation mapping of the film surface on the film formation side composed of Ga oxide in a 500 μm×500 μm field. The conditions for the EBSD measurement were described below.

<EBSD Measurement Conditions>
Accelerating voltage: 15 kV
Spot intensity: 70
Working distance: 22.5 mm
Step size: 0.5 μm
Sample tilt angle: 70 degrees
Measurement program: Aztec (version 3.3)

The inverse pole figure orientation mapping showed that the Ga oxide film had a biaxially-oriented corundum crystal structure with C-axis orientation in the direction normal to the substrate and with in-plane orientation. This showed the formation of an alignment film formed of α-$Ga_2O_3$.

(2c) Measurement of Plane CL Intensity Mapping

The film was subjected to a plane CL intensity mapping measurement using a CL spectrometer (spectrometer: iHR-320 manufactured by Horiba, Ltd., SEM: Schottky emission-type SEM JSM-7100F/TTLS manufactured by JEOL Ltd.) in twenty fields with a 5 μm×5 μm field. The plane CL intensity mapping measurement was performed under the following conditions.

<Plane CL Intensity Mapping Measurement Conditions>
Detector: CCD (Jobin Yvon)
Diffraction grating of spectrometer: 100 gr/mm, blaze wavelength 450 nm
Number of CL image pixels: 51×51
CL spectrum integration time: 10 ms×1
Measurement temperature: Room temperature
Irradiation current: 4.8 nA
Accelerating voltage: 10 kV
W.D.: 10.3 mm
Number of SEM image pixels: 250×250

Figure 4:
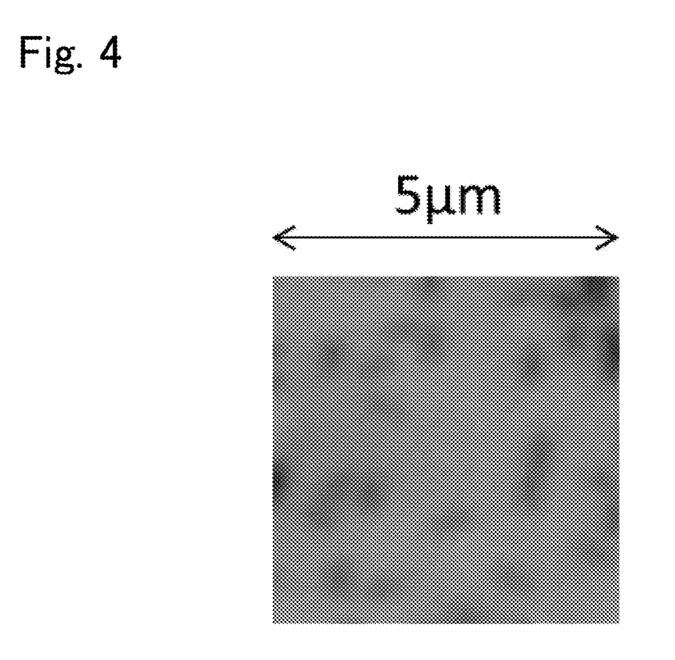
FIG. 4 is a plane CL intensity mapping image of Example 1.
Figure 5:
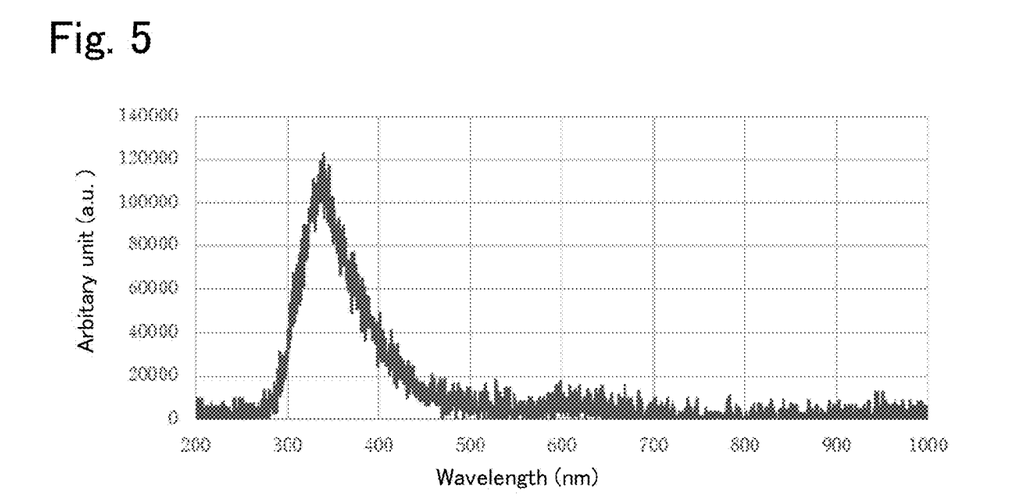
FIG. 5 is a graph of an example of a CL spectrum at a measurement point within the top 5% of the maximum emission intensities A at all measurement points in Example 1.
Figure 6:
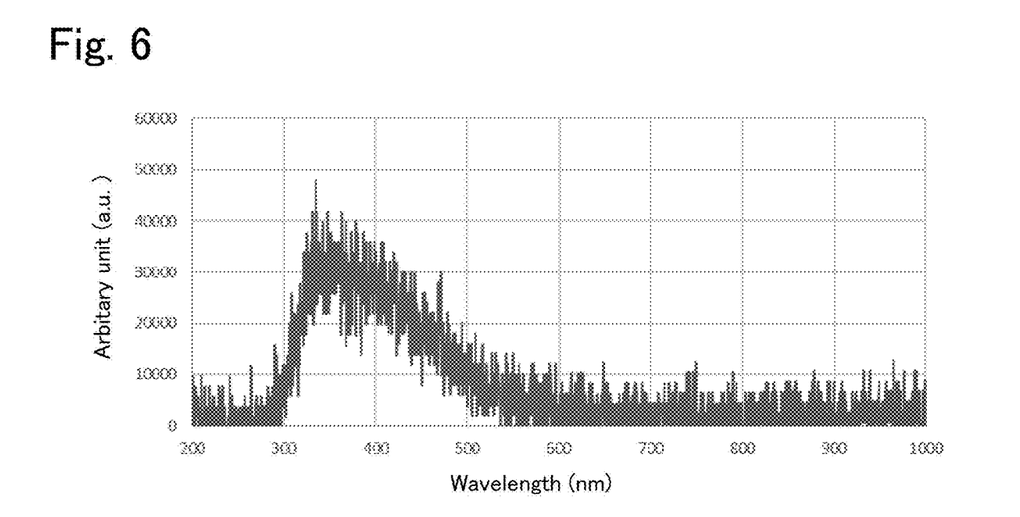
FIG. 6 is a graph of an example of a CL spectrum at a dark spot in Example 1.

The value (ratio R) of (the number of dark spots)/(the number of all measurement points) calculated from all CL image measurement points was 0.053. FIG. 4 shows a mapping image obtained by integrating emission intensities in the wavelength range of 277 to 361 nm in a plane CL intensity mapping measurement. The maximum emission intensity A in the wavelength range of 250 to 365 nm was determined at each measurement point in the plane CL intensity mapping measurement, and the average value X of the top 5% of the maximum emission intensities A at all measurement points was determined. A measurement point with a maximum emission intensity A of not more than 0.6 times the X was defined as a dark spot. FIG. 5 shows an example of a CL spectrum at a measurement point within the top 5% of the maximum emission intensities A at all measurement points. FIG. 6 shows an example of a CL spectrum at a dark spot (2d) Appearance Evaluation of Semiconductor Film The appearance of the semiconductor film was observed in a polarization/differential interference mode over the entire surface with an industrial microscope (ECLIPSE LV150N manufactured by Nikon Corporation) equipped with a 10× ocular lens and a 5× objective lens, and no cracks were observed.

(3) Production and Evaluation of Device

After a 2 mm×8 mm region in an end portion of the semiconductor film 14 (8 mm×8 mm) of the multilayer structure 10 formed in (1c) was masked with a sapphire substrate (not shown), an n− layer was formed. The n− layer was formed in the same manner as in (1) except that a dopant (more specifically, tin(II) chloride) was not added in the preparation of the raw material solution in (1a) and the film-forming time was 20 minutes. After the n− layer was formed, the masking sapphire substrate (not shown) was removed to expose an n+ layer. A Ti electrode (ohmic electrode) was formed in the exposed region of the n+ layer, and a Pt electrode (Schottky electrode) was formed on the n-layer. Thus, a lateral Schottky barrier diode was produced. Application of a predetermined voltage to the Schottky barrier diode in the reverse direction caused a negligible leakage current, thus showing good device characteristics.

Although the Schottky barrier diode in the present example was a lateral device to simply evaluate the device characteristics, a vertical device produced by removing the base substrate 12 also has the same tendency as the lateral device according to the present example.

Example 2

An α-$Ga_2O_3$ film was formed in the same manner as in Example 1 except that the temperature in the quartz tube 47 at which the α-$Ga_2O_3$ film was formed by the mist CVD method was 430° C. Various evaluations were performed. The ratio R was 0.192. The entire film surface was observed in the same manner as in Example 1, and no cracks were observed. Application of a predetermined voltage to the Schottky barrier diode produced in the same manner as in Example 1 in the reverse direction caused a negligible leakage current, thus showing good device characteristics, as in Example 1.

Example 3

An α-$Ga_2O_3$ film was formed in the same manner as in Example 1 except that a surface of a commercial $Cr_2O_3$ single crystal (8 mm×8 mm, 0.5 mm in thickness, C-plane, no off-angle) serving as a base substrate for film formation was ground to have a surface roughness Ra of 50 nm and the temperature in the quartz tube 47 at which the α-$Ga_2O_3$ film was formed by the mist CVD method was 430° C. Various evaluations were performed. The ratio R was 0.583. The entire film surface was observed in the same manner as in Example 1, and no cracks were observed. Application of a predetermined voltage to the Schottky barrier diode produced in the same manner as in Example 1 in the reverse direction caused a leakage current slightly larger than that in Example 1.

Example 4

An α-$Ga_2O_3$ film was formed in the same manner as in Example 1 except that a surface of a commercial $Cr_2O_3$ single crystal (8 mm×8 mm, 0.5 mm in thickness, C-plane, no off-angle) serving as a base substrate for film formation was ground to have a surface roughness Ra of 170 nm and the temperature in the quartz tube 47 at which the α-$Ga_2O_3$ film was formed by the mist CVD method was 390° C. Various evaluations were performed. The ratio R was 0.692. The entire film surface was observed in the same manner as in Example 1, and no cracks were observed. Application of a predetermined voltage to the Schottky barrier diode produced in the same manner as in Example 1 in the reverse direction caused a leakage current larger than that in Example 3.

Example 5

An α-$Ga_2O_3$ film was formed in the same manner as in Example 1 except that the gallium acetylacetonate concentration was 0.07 mol/L, the flow rate of the diluent gas was 0.4 L/min, the flow rate of the carrier gas was 0.8 L/min, the temperature in the quartz tube 47 was 615° C., and the film-forming time was 60 minutes in the formation of the α-$Ga_2O_3$ film by the mist CVD method. Various evaluations were performed. The ratio R was 0.008. The entire film surface was observed in the same manner as in Example 1, and a small number of cracks were observed. Application of a predetermined voltage to the Schottky barrier diode produced in the same manner as in Example 1 in the reverse direction caused a negligible leakage current, thus showing good device characteristics, as in Example 1.

Comparative Example 1

Figure 7:
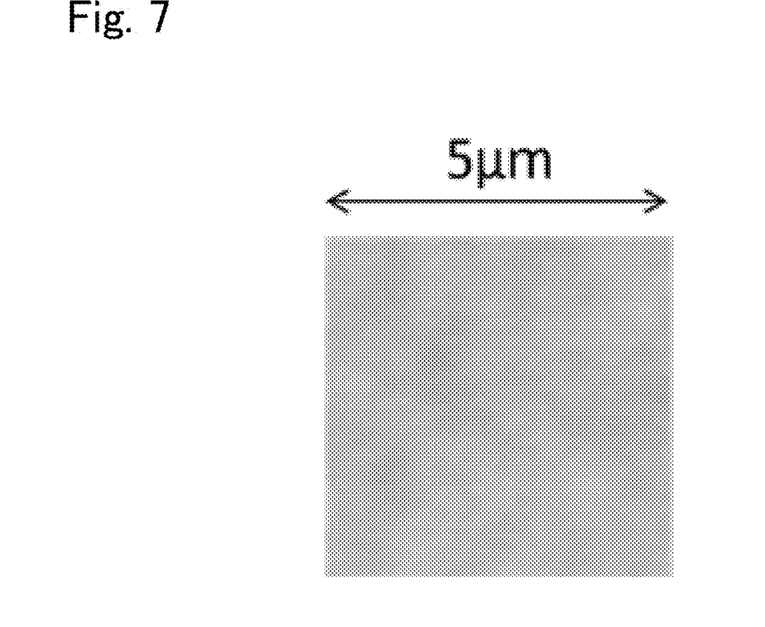
FIG. 7 is a plane CL intensity mapping image of Comparative Example 1.

An α-$Ga_2O_3$ film was formed in the same manner as in Example 1 except that a C-plane sapphire substrate 5.08 cm (2 inch) in diameter and 0.65 mm in thickness was used as a base substrate for film formation and the temperature in the quartz tube 47 at which the α-$Ga_2O_3$ film was formed by the mist CVD method was 430° C. Various evaluations were performed. FIG. 7 shows a mapping image obtained by integrating emission intensities in the wavelength range of 277 to 361 nm in a plane CL intensity mapping measurement. The ratio R was 0.000. In FIG. 7, the contrast of the mapping image is adjusted to emphasize the emission intensity difference within the CL measurement range. Although FIG. 7 therefore appears brighter than FIG. 4, the actual emission intensity is smaller than that in Example 1. The entire film surface was observed in the same manner as in Example 1, and a large number of cracks were observed. Application of a predetermined voltage to the Schottky barrier diode produced in the same manner as in Example 1 in the reverse direction caused a leakage current much larger than that in Example 4.

Comparative Example 2

(1) Formation of α-$Cr_2O_3$ Film

The mist CVD apparatus 40 illustrated in FIG. 2 was used to form an α-$Cr_2O_3$ film on the surface of a sapphire substrate (50.8 mm (2 inches) in diameter, 0.43 mm in thickness, C-plane, off-angle of 0.3 degrees) by the following method.

(1a) Adjustment of Raw Material Solution

An aqueous solution was adjusted at an ammonium dichromate concentration of 0.1 mol/L and was used as the raw material solution 44a.

(1b) Preparation of Film Formation

Next, the raw material solution 44a was poured into the mist generation source 44 of the mist CVD apparatus 40 illustrated in FIG. 2. A sapphire substrate was placed on the susceptor 50 as the base substrate 12, and the temperature in the quartz tube 47 was increased to 420° C. with the heater 48. The flow control valves 43a and 43b were then opened to supply a diluent gas and a carrier gas to the quartz tube 47 from the diluent gas source 42a and the carrier gas source 42b. After the atmosphere in the quartz tube 47 was sufficiently replaced with the diluent gas and the carrier gas, the flow rate of the diluent gas was adjusted to 2.2 L/min, and the flow rate of the carrier gas was adjusted to 4.8 L/min. Nitrogen gas was used as the diluent gas and the carrier gas.

(1c) Film Formation

Next, the ultrasonic transducer 46 was vibrated at 2.4 MHz, and the vibration was transmitted through the water 45a to the raw material solution 44a to form the mist 44b of the raw material solution 44a. The mist 44b was introduced with the diluent gas and the carrier gas into the quartz tube 47 serving as a film formation chamber, was reacted in the quartz tube 47, and formed an oxide deposited layer on the base substrate 12 by a CVD reaction on the surface of the base substrate 12. The film-forming time was 50 minutes. Thus, a composite base substrate with the oxide deposited layer on the sapphire substrate 12 was formed.

(1d) Surface EDX

An energy dispersive X-ray analyzer (EDX) was used to analyze the composition of the composite base substrate surface. The results showed that only Cr and O were detected, and the oxide deposited layer was Cr oxide.

(1e) Surface EBSD

A SEM (SU-5000, manufactured by Hitachi High-Technologies Corporation) equipped with an electron beam backscatter diffraction apparatus (EBSD) (Nordlys Nano, manufactured by Oxford Instruments) was used to perform inverse pole figure orientation mapping of the substrate surface composed of the Cr oxide layer in a 500 μm×500 μm field. The conditions for the EBSD measurement were described below.

<EBSD Measurement Conditions>
  Accelerating voltage: 15 kV
  Spot Intensity: 70
  Working distance: 22.5 mm
  Step size: 0.5 μm
  Sample tilt angle: 70 degrees
  Measurement program: Aztec (version 3.3)

The inverse pole figure orientation mapping showed that the Cr oxide layer had a corundum crystal structure with C-axis orientation in the direction normal to the substrate. However, a domain was observed at 60 degrees to the in-plane direction. The results showed that a C-axis oriented layer of α-$Cr_2O_3$ was formed on the substrate surface.

(2) Formation of α-$Ga_2O_3$ Film

An α-$Ga_2O_3$ film was formed in the same manner as in Example 1 on the composite base substrate formed in (1), and various evaluations were performed. The ratio R was 0.000. The entire film surface was observed in the same manner as in Example 1, and a large number of cracks were observed. Application of a predetermined voltage to the Schottky barrier diode produced in the same manner as in Example 1 in the reverse direction caused a leakage current much larger than that in Example 4.

Table 1 summarizes the results for Examples 1 to 5 and Comparative Examples 1 and 2.

TABLE 1

|  | R | Cracks | Leakage current |
|---|---|---|---|
| Example 1 | 0.053 | None | None |
| Example 2 | 0.192 | None | None |
| Example 3 | 0.583 | None | Slightly larger than that in Example 1 |
| Example 4 | 0.692 | None | Slightly larger than that in Example 3 |
| Example 5 | 0.008 | None | None |
| Comparative Examples 1 and 2 | 0 | Large number | Much larger than that in Example 4 |

What is claimed is:

1. An α-$Ga_2O_3$ semiconductor film having a dark spot, which is defined as a measurement point with a maximum emission intensity A of not more than 0.6 times an average value X of top 5% of the maximum emission intensities A at all measurement points in intensity mapping of plane cathodoluminescence, wherein the maximum emission intensity A at each measurement point is determined in a wavelength range of 250 to 365 nm.

2. The α-$Ga_2O_3$ semiconductor film according to claim 1, wherein a ratio R of the number of dark spots to the number of all measurement points ranges from 0.005 to 0.200.

3. The α-$Ga_2O_3$ semiconductor film according to claim 2, wherein the ratio R ranges from 0.050 to 0.200.

* * * * *